United States Patent [19]

Barron, Jr. et al.

[11] Patent Number: 5,077,467
[45] Date of Patent: Dec. 31, 1991

[54] PHOTOELECTRIC SWITCH AND RELAY SYSTEM WITH DISABLING FAIL-SAFE MONITORING CIRCUITRY

[75] Inventors: Kenneth L. Barron, Jr., Bartlett; Staton P. Williams, Jr., Bloomingdale, both of Ill.

[73] Assignee: Triad Controls, Inc., Carol Stream, Ill.

[21] Appl. No.: 581,002

[22] Filed: Sep. 12, 1990

[51] Int. Cl.$^5$ .................. G01V 9/04; G06M 7/00; H01J 40/14
[52] U.S. Cl. .................................................. 250/221
[58] Field of Search ............... 250/221, 222.1, 208.4; 340/555, 556, 557; 361/177, 189, 193

[56] References Cited

U.S. PATENT DOCUMENTS

| Re. 23,674 | 6/1953 | Spierer . | |
|---|---|---|---|
| 2,261,431 | 11/1941 | Braun . | |
| 3,207,957 | 5/1962 | Naylor . | |
| 3,242,341 | 3/1966 | Woodward . | |
| 3,360,654 | 12/1967 | Muller . | |
| 3,398,290 | 11/1969 | Baseshore et al. . | |
| 3,478,220 | 11/1969 | Milroy . | |
| 3,704,396 | 11/1972 | Macdonald . | |
| 3,805,085 | 4/1974 | Andrews . | |
| 3,842,260 | 10/1974 | Christensen et al. . | |
| 3,895,269 | 7/1975 | Geremia . | |
| 3,914,621 | 10/1975 | Passarelli, Jr. . | |
| 3,928,849 | 12/1975 | Schwarz | 250/221 |
| 3,944,818 | 3/1976 | Bechtel | 250/221 |
| 4,015,122 | 3/1977 | Rubinstein . | |
| 4,074,602 | 2/1978 | Brower . | |
| 4,185,192 | 6/1980 | Wagner . | |
| 4,227,547 | 10/1980 | Cameron . | |
| 4,239,961 | 12/1980 | Lasar . | |
| 4,249,074 | 2/1981 | Zettler et al. . | |
| 4,310,836 | 1/1982 | Stanzani | 250/221 |
| 4,358,651 | 11/1982 | Hosteler et al. . | |
| 4,388,528 | 6/1983 | Walter . | |
| 4,406,530 | 9/1983 | Hasegawa et al. . | |
| 4,412,268 | 10/1983 | Dassow . | |
| 4,479,053 | 10/1984 | Johnston . | |
| 4,520,262 | 5/1985 | Denton . | |
| 4,563,578 | 1/1986 | Nagai et al. . | |
| 4,716,992 | 1/1988 | Kunii . | |
| 4,939,358 | 7/1990 | Herman et al. . | |

Primary Examiner—David C. Nelms
Assistant Examiner—John R. Lee
Attorney, Agent, or Firm—Lee, Mann, Smith, McWilliams & Sweeney

[57] ABSTRACT

A hand operated photoelectric switch having a channel providing an interrupt area for an operator's hand to pass into the path of an infrared light beam passing from a light emitting diode to a phototransistor sensor. Said housing further including circuitry for operating a mechanical relay to be activated for the operation of electrical machinery. A monitoring circuit is provided to monitor the light emitting diode and a driver transistor for the mechanical relay whereby to detect the failure of either one and disable the circuit from accidentally providing contant closure of the mechanical relay.

17 Claims, 2 Drawing Sheets

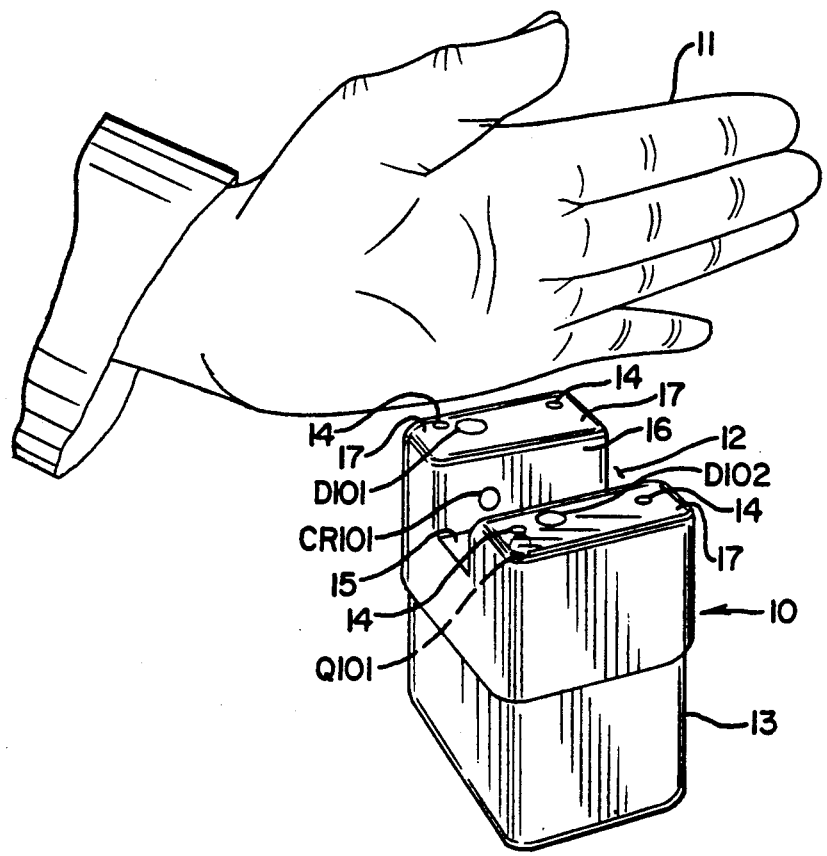
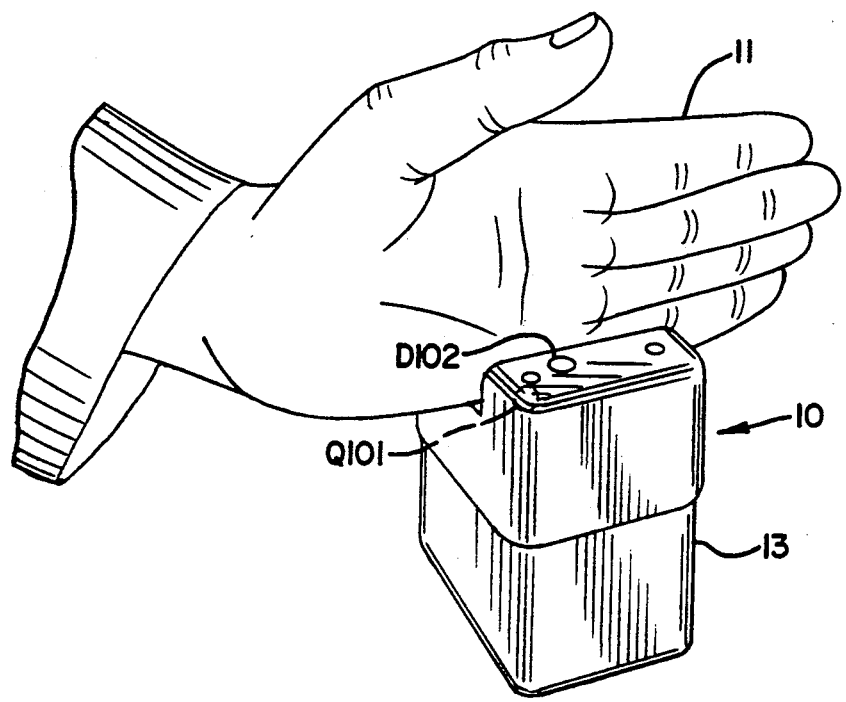

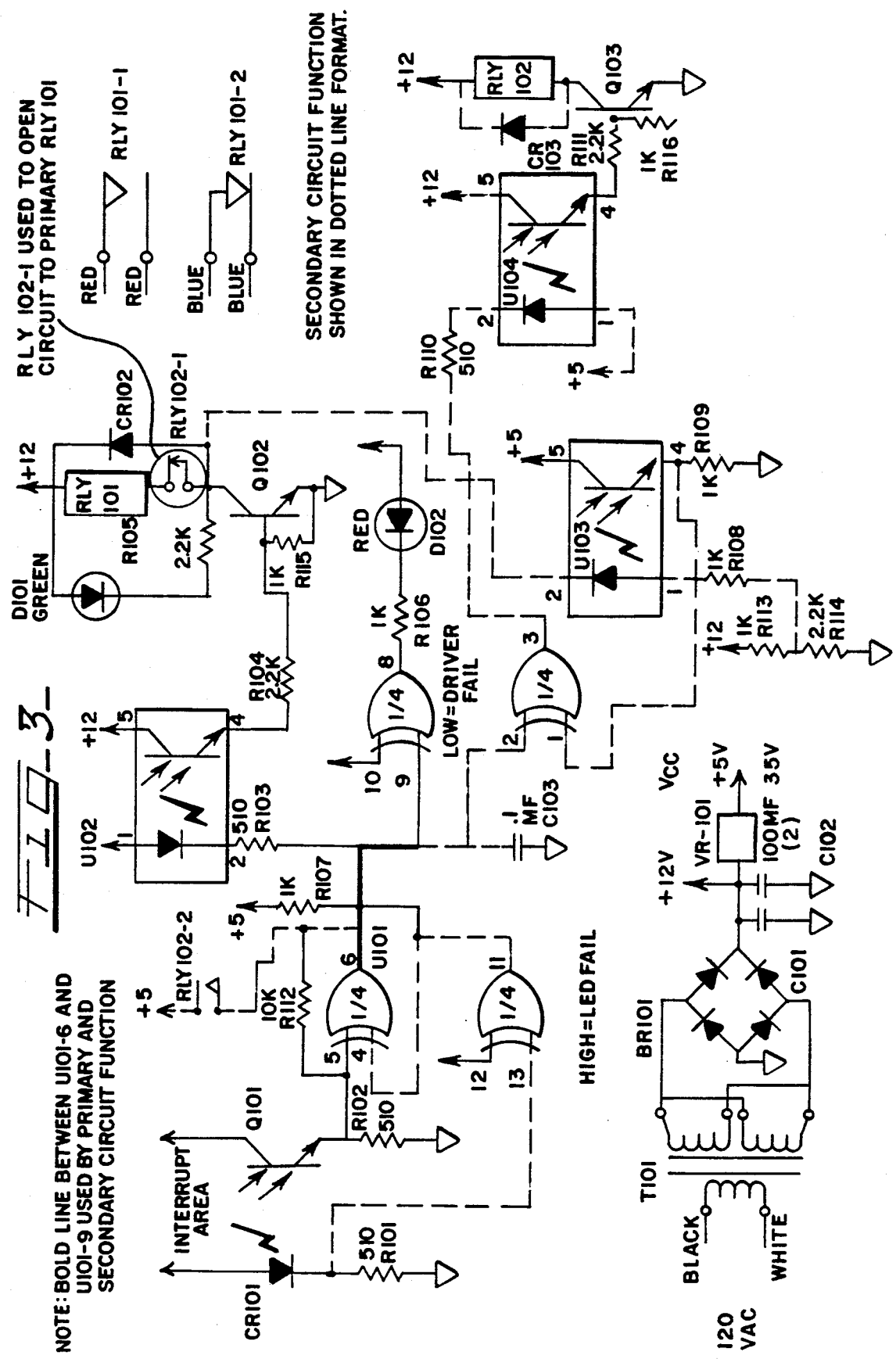

PHOTOELECTRIC SWITCH AND RELAY SYSTEM WITH DISABLING FAIL-SAFE MONITORING CIRCUITRY

BACKGROUND OF THE INVENTION

The invention relates to hand-operated switches for repetitively activating large industrial equipment such as power presses, molding machines, riveting machines and the like. The invention is more specifically related to a photoelectric switch wherein an infrared light beam may be broken by the hand to activate a mechanical relay to thereby energize the associated machinery. More specifically, the invention is directed toward providing a switch that prevents inadvertent passage of the operator's hand past the light beam and also monitoring circuitry for detecting the failure of primary components of the system and disabling the relay circuitry from accidental operation.

It is known in the art to provide for an infrared photoelectric switch in replacement of conventional palm buttons or other manually operable switches used for activation of heavy machinery. For example, with the use of power presses or riveting machines, cycling of the machine is repeated on successive work pieces, or onto a continuous fed line of work stock, to perform a mechanical function at regular intervals. Sometimes, the operator positions the work piece with the machine and then activates the equipment to perform a mechanical procedure. Otherwise, mechanical feed means may supply the work piece, such as sheet metal to be bent or riveted, automatically to the machine, whereupon detecting the proper positioning of the work piece, the operator energizes the equipment by means of the switch. The previously used palm buttons, push buttons, and mechanical lever switches, have resulted in employee hand and arm injuries, including tendonitis, muscle strain and ligament damage. These have therefore been typically replaced by the use of photoelectric sensor switches wherein typically a light beam is transmitted from a diode to an infrared phototransistor. By interrupting the light beam, a mechanical contact closure results and a mechanical relay is activated for energizing the associated power press molding machine, etc.

While the use of photoelectric switches is generally known, problems have resulted in the poor structural configuration of the prior art switch boxes. Often, prior art devices have used infrared light beams passing across a channeled switch box for the insertion therein of the operator's hand. Most commonly, the configuration of the light beam within the channel allows for the unintentional passage of the operator's finger, or fingers, through and past the beam whereby the beam is re-established across the channel as the finger(s) inadvertently move therepast. This may not be detected by the operator and causes a dangerous situation when the operator removes his finger(s) outwardly of the channel and breaks the light beam again for an unintentional and potentially injurious re-activation of the machinery. Some rudimentary cures for this defect involve operators on-site making finger blocking devices in the beam-interrupt area of the switches to prevent passage of the hand past the light beam. Other manufacturers of photoelectric switches have provided for double infrared beams that might require either or both to be broken to activate the mechanical relay for the machinery. Problems of the same nature have arisen in these types switches also.

Another concern in the industry is the capability of mounting photoelectric switch boxes in replacement of palm-buttons on existing equipment. Special brackets and mounts have been needed to fit the switch to the electric connection boxes on the machinery. It would therefore be desirable to provide for a photoelectric switch and relay system that overcomes the foregoing problems including the capability of attachment to existing machinery without the need for special mechanical adaptors or attachments.

A further object of the invention would be to provide for a photoelectric switch and relay system wherein the electrical circuitry contained within the switch box provides a fail-safe, disabling monitor circuitry for monitoring key components of the circuit to detect failure. Such failure is quite common due to the constant on-off activation and the continuous operation of, for example, an infrared light emitting diode projecting a beam to an infrared phototransistor. It is therefore a goal of the invention to provide a primary function circuit for operating a mechanical press relay by the interruption of a light beam in combination with a disabling backup circuitry for providing a fail-safe provision for at least two of the main operable circuit components of the primary circuit.

SUMMARY OF THE INVENTION

The invention may be summarized as a photoelectric switch and relay system with disabling fail-safe monitoring circuitry all provided in a generally block U-shaped switch box structure. The switch box structure provides for the placement of a beam interrupt area closely adjacent the bottom of a hand channel whereby to prevent the inadvertent passage of the operator's hand or fingers beyond, otherwise causing an unintentional re-passage of the beam thereacross while the finger(s) have not yet been withdrawn. The photoelectric switch box configuration further provides for the placement of light indicators for observations of activation or inactivation of the mechanical relay energizing the associated mechanical equipment. The invention includes a primary circuit whereupon at the interruption of a beam from an infrared light emitting diode to a phototransistor, a driver transistor is activated to activate a mechanical relay for cycling the press, molding machine, etc. An associated secondary function, monitoring circuit is provided whereby upon the failure of the infrared light emitting diode, a false interrupt signal is prevented from occurring and therefore the driver transistor does not activate the mechanical relay. The driver transistor for the output or mechanical relay is also monitored, so that in the event there is a driver failure, but the beam is not obstructed, the failure is "safe" and the mechanical relay circuit is opened to prevent contact closure, even though the operator's hand interrupts the beam. The invention further provides for the utilization of an integrated circuit with plural exclusive OR gate chips, for the primary and secondary circuitry, whereby imposed high and low outputs at certain pin locations provide the fail-safe operation of the system.

BRIEF DESCRIPTION OF THE DRAWING

FIG. 1 is a perspective view of the photoelectric switch and relay system in accordance with the invention showing the hand of an operator poised above a channel in position to move therein and break an infrared light beam passing across the channel;

FIG. 2 is another perspective view of the invention showing the operator's hand moved into the channel of the switch box to interrupt the beam to activate of a mechanical relay for cycling associated machinery; and, FIG. 3 is a wiring schematic having primary and secondary circuits in accord with the invention.

DETAILED DESCRIPTION OF THE INVENTION

With reference initially to FIGS. 1 and 2, there is illustrated a switch box 10 capable of replacing conventional electrical push button switches used for cycling heavy industrial machinery, such as stamping presses, riveters, spot welders, and the like. The switch box 10 includes unique circuitry as part of the invention and will be described later with respect to FIG. 3. The novel construction of the switch box 10 allows for the movement of the operator's hand 11 within a recessed channel 12. The switch box 10 has a generally block U-shape as seen in the perspective views of FIGS. 1 and 2 in the preferred form of the invention.

An electrical junction box 13 is electrically and mechanically engaged by the switch box 10. The box 13 is representative of electric outlet boxes for industrial machinery usually activated by switches or palm buttons for operation of the machinery and may be of any known type. The switch, box 10 is electrically and mechanically attachable to the box 13 such as by conventional threaded screw fasteners 14 extending through the box 10 for thread engagement with standard threaded connectors of an electric outlet box 13 (not shown).

The channel 12 is less in width than length and provides for the edge-wise insertion of the hand 11 as shown. The channel 12 has a bottom wall 15 and two parallel side walls 16 that meet upper planar surfaces 17 of the U-shaped box 10 and through which the screw fasteners 14 extend downward as shown. Upward along one wall 16 resides an infrared light emitting diode CR101. At the opposite wall 16, and shown in hidden lines, an infrared phototransistor Q101 is aligned with the infrared light emitting diode CR101 whereby an infrared light beam may pass therebetween. The spacing of the infrared light emitting diode CR101 above the bottom wall 15 is a distance sufficient so that even small fingers of a user's hand can move to interrupt the beam between the diode CR101 and phototransistor Q101 but they are prevented from moving downwardly past the beam by the reason of the close proximity of the bottom wall 15. While, of course, hand and finger sizes are widely different, it is expected that a spacing of the central axis of the light beam no more than about ½ inch above the bottom wall 15 will achieve the intended goal. As a result, the prior art difficulties with the inadvertent passage of a hand or fingers past the beam, or beams, is avoided.

As illustrated in FIG. 2, when the hand 11 moves downwardly into the channel 12, the beam from the diode CR101 is interrupted and results in the activation of a mechanical relay to energize the associated machinery to initiate a mechanical procedure, such as pressing, bending, welding, riveting, and the like. The intention with the switch box 10 is to allow for the operator to position, or have mechanically positioned for him, a work piece relative to the machinery and upon reaching the correct position, the operator moves his hand, or finger, into the channel 12 to initiate the mechanical action. At the upper walls 17 are located a light emitting diode D101 on one wall 17 and light emitting diode D102 on the other. These are strictly indicators to the operator. In the exemplary embodiment, D101 is a green diode and D102 is a red diode. When the beam is unobstructed, the red diode D102 is lit. When the beam is obstructed, then diode D101 is lit and D102 is off indicating that a relay energizing the associated industrial machinery is activated. The electrical circuitry for the particular machinery will be joined in electrical connection with the mechanical relay to cycle the machinery in the particular way in which it might operate. The length or nature of the mechanical apparatus cycle and separate circuitry therefor form no part of the present invention as would be understood. Therefore the resultant of the hand activation is to provide an isolated relay contact closure to the end user when the infrared beam is obstructed. Upon the contact closure, the separate circuitry for the machinery may go through its own separate preset cycle which might be a simple stamping stroke, or the cooperative effect of several mechanical elements in the device during bending or riveting cycle; all such machinery can be electrically linked to the present invention. As a result, upon the contact closure the switch 10 serves its primary purpose and as the operator's hand is retracted from the position within the channel 12, the contact closure ends and the mechanical relay is open, the fuller details of which will be next described.

Now, turning to FIG. 3, the circuit for the photoelectric switch and relay system is disclosed. The circuit is drawn in conformance with standard electrical symbols and includes certain portions in dotted lines to distinguish primary and secondary circuit functions. Initially it should be understood that the hand 11 moves through the "interrupt area" as labelled to break the beam from the infrared light emitting diode CR101 to the infrared phototransistor Q101. This results in the closure of a mechanical relay RLY101 for cycling the machinery as explained. This is the primary function of the invention. The second circuit function is to monitor the condition of components used in the circuit that achieve the primary function and, in the event of a malfunction, disable the primary circuit. The operation of the primary circuit will be discussed first.

Primary Circuit Function and Operation

The arrangement of the infrared light emitting diode CR101 and the infrared phototransistor Q101 maintains the infrared beam therebetween which must be broken in order to provide the contact closure at relay RLY101. As long as power is supplied to the infrared light emitting diode CR101, the infrared light beam is directed toward the phototransistor Q101.

The power supply is shown in the lower left hand of FIG. 3 and consists of a transformer T101 with 120 vac primary and 9 vac secondary, a full wave bridge rectifier BR101, two filter capacitors C101, C102 and a three terminal 5 v regulator VR101

In the schematic drawing, solid lines indicate the primary circuit and dotted lines show the secondary circuit. The bold line between a pin 6 of an integrated circuit U101 and a pin 9 of U101 is shared by both circuits.

The integrated circuit U101 has four exclusive OR gate chips operating with pins numbered 1-12, each operating as follows:

| Input A | Input B | Output |
|---------|---------|--------|
| high | low | high |
| low | high | high |
| low | low | low |
| high | high | low |

The intensity of the infrared light beam emitted by the infrared light emitting diode CR101 is at sufficient level to cause the infrared phototransistor Q101 to conduct to saturation. This keeps a high level on pin 5 of the integrated circuit U101. Pin 4 of the integrated circuit U101 is normally low and will be discussed in the description of the secondary circuit function.

When the light beam is obstructed by the operator's hand or finger, the infrared phototransistor Q101 turns off and pin 5 of integrated circuit U101 goes low due to resistor R102. Pin 6 of integrated circuit U101 then goes low. This causes current to flow in the diode of an integrated circuit/optocoupler U102, thereby turning on the transistor in the optocoupler U102. The optocoupler U102 is an infrared optical coupler which when activated provides the base current for an n-p-n transistor Q102. Activation of the optocoupler U102 also causes pin 9 to go high changing the state at pin 8 causing red diode D102 to turn off. The n-p-n transistor Q102 is the driver for the relay RLY101. When the driver n-p-n transistor Q102 is on, the relay RLY101 is up and the isolated contact closure is provided for energizing the associated machine.

When the beam is obstructed, the two visible light emitting diodes D101 and D102 switch states. As noted above, diode D102 is a red light emitting diode which is illuminated any time the beam is not obstructed and goes out when it is obstructed, at which point diode D101, a green light emitting diode, illuminates. Diodes D101 and D102 are indication lights to the operator and serve no other function.

A resistor R112 between pins 5 and 6 of the integrated circuit U101 provides some hysteresis.

In the disclosed embodiment for the circuit, resistors R101, 102, 103 and 110 are 510 ohm, ¼w, 5% CF; resistors R104, 105, 111 and 114 are 2.2K, ¼w, 5% CF; and, resistors R106, 107, 108, 109, 113, 115 and 116 are 1K, ¼w, 5% CF. The resistor R112 is 10K, ¼w, 5% CF.

Secondary Circuit Function and Operation

In connection with the primary circuit there is provided a secondary circuit used to monitor critical areas of the primary circuit. These areas critical to the operation of the primary circuit are the infrared light emitting diode CR101 and the driver n-p-n transistor Q102. If the light emitting diode failed, the result would be identical to the operator placing his hand or finger in the interrupt area of the channel 12. It is the intention of the secondary circuit to prevent this from occurring should the light emitting diode CR101 fail. The driver n-p-n transistor Q102 when conducting drives the mechanical relay RLY101 for the operation of the associated machinery. It is known that transistors are likely to fail in either high or low states. Should n-p-n transistor Q102 fail in a high state, it will continue to conduct and the relay RLY101 will remain energized to cycle the associated machine. A secondary circuit prevents this unintentional energization from happening.

There is therefore most importance given to monitoring these critical areas. The secondary circuit does not function to monitor every part of the primary circuit nor check the parts used in the secondary circuit itself. In monitoring these two critical areas from the primary circuit, at least a second order failure is required before an unsafe condition could develop. One skilled in the art would know that certain parts in electronic assemblies tend to fail in certain predictable ways and it is economically most effective, while staying within cost and space restrictions, to monitor crucial—not all—areas for failure.

It is also a function of the secondary circuit to disable the primary circuit upon detection of failure of either monitored component and prevent unwanted activation of the mechanical relay RLY101.

Failure Detection for Infrared Light Emitting Diode CR101

As it is explained above, any time power is applied to the primary circuit, the diode CR101 is conducting and emitting light. The more common failure mode of infrared light emitting diodes is for them to stop conducting or "open". This type of failure would have the same effect as blocking the beam with one's finger. The secondary circuit checks for this condition. Should the diode CR101 open, the pin 13 of the integrated circuit U101 goes low and causes pin 11 to go high. The pin 5 will then be low because the phototransistor Q101 will not be conducting. The net result is that pin 6 does not change states and remains high, thereby preventing a false signal. In normal operation, breaking the beam causes pin 6 to go low.

Thus, although no light beam passes through the interrupt area, the primary circuit is disabled from activating mechanical relay RLY101.

Failure Detection of Driver N-P-N Transistor Q102

When n-p-n transistor Q102 is conducting, it thereby drives the mechanical output relay RLY101 for cycling the associated machinery. The more common way a small signal transistor of this type tends to fail is to continue to conduct when otherwise it should be off. This could be commonly termed a "short". This type of failure at n-p-n transistor Q102 would have the effect of providing output to relay RLY101 when not intended. It is not necessary to check for a non-conductive, or "open" state failure of the transistor, since this failure would be a safe failure, i.e. relay RLY101 would not be activated.

When the n-p-n transistor Q102 is conducting, a second integrated circuit/optocoupler U103 will also be conducting and cause pin 1 of the integrated circuit U101 to be in a high state. In normal operation, pin 2 of the integrated circuit U101 should be low when this condition exists. Pin 3 of the integrated circuit U101 then should never go low as pins 1 and 2 of the integrated circuit U101 should always be in opposite states. If the n-p-n transistor Q101 experiences a short and causes the high state on pin 1 of integrated circuit U101, but the beam is not obstructed, pin 2 of the integrated circuit U101 will be high also. As a result, pin 3 of integrated circuit U101 will then go to the low state. The primary circuit is disabled upon pin 3 reaching the low state. This disablement occurs because as a result of third integrated circuit/optocoupler U104 turned on and, in the same manner as the optocoupler U102, an n-p-n transistor Q103 conducts to pick up a relay RLY102. The action of relay RLY102 results in two things: It opens the circuit to mechanical relay RLY101 so that it drops out; and, it latches pin 2 of the integrated circuit U101 in the high state so that the condition remains and the switch 10 remains inoperable.

Those skilled in the art would further understand the schematic diagram as including rectifier diodes CR102 and CR103. Further, in the exemplary embodiment the filter capacitors C101 and 102 are 11 mf 25 v elect. axial capacitors and the capacitor C103 is 0.1 mf ceramic.

The foregoing description is provided to show a preferred embodiment of the invention but other equivalent components and devices fall within the scope of the invention and within the scope of the claims appended hereto.

What is claimed is:

1. Photoelectric switch and relay system, including circuit therefor, comprising:
    switch box means having channel means for placement of an operator's hand or fingers therein;
    light emitting means for emitting a light beam across said channel means;
    light beam sensor means being electrically conductive responsive to said light beam;
    means for connecting said light beam sensor means to a first optical coupler means;
    means for causing said first optical coupler means to be electrically conductive upon the interruption of said light beam to said light beam sensor means and generate a current;
    means for connecting said first optical coupler means to a driver means, and means for causing said driver means to be electrically conductive upon receipt of said current from said first optical coupler means;
    mechanical relay means;
    means for connecting said mechanical relay means to said driver means wherein upon said driver means being electrically conductive said mechanical relay means being closed thereby;
    monitoring means for detecting failure of said light emitting means including means for preventing said light beam means from causing said first optical coupler means to conduct;
    monitoring means for detecting failure of the driver means, including second optical coupler means, means for connecting the second optical coupler means to the driver means, the second optical coupler means being operable upon the electrical conduction of said driver means, and the monitoring means further including means for detecting electrical conduction of said light beam sensor means, and means responsive to a concurrent conduction at both said light beam sensor means and said driver means for opening electrical connection to said mechanical relay thereby preventing closure thereof.

2. The system as in claim 1 wherein the light emitting means comprises an infrared light emitting diode.

3. The system as in claim 1 wherein said light beam sensor means comprises an infrared phototransistor.

4. The system as in claim 1 wherein said means responsive to said concurrent conduction comprises a third optical coupler means.

5. A switch box for activation of a relay means by the passage of an operator's hand and/or fingers through a light beam comprising:
    a switch box having a channel means for receipt therein of an operator's hand or fingers;
    a photoelectric light beam source at one side of said channel means and a light receiving phototransistor means at the other side being electrically conductive during receipt of the light beam;
    said switch box further including a bottom wall means of said channel means and wherein said light beam is spaced closely above said bottom wall for preventing the passage of an operator's finger past the light beam;
    said switch box including circuit means for activating the relay means;
    said circuit means being capable of connection of the relay means to electrical machinery for the activation thereof;
    the circuit means further comprised of
        primary circuit means for activating a driver transistor means, said driver transistor means being capable of being electrically conductive upon the interruption of said light beam between said photoelectric light beam source and the light receiving phototransistor means for activating said relay means; and,
        secondary circuit means for detecting the failure of said photoelectric light beam source and means for detecting the failure of said driver transistor means, said secondary circuit means further including means for disabling said primary circuit means whereby to prevent activation of said relay means upon the failure of either said photoelectric light beam source or said driver transistor means.

6. The switch box as claimed in claim 5 wherein said primary and secondary circuit means include an integrated circuit having a plurality of exclusive OR gate chips.

7. The switch box as claimed in claim 6 wherein one of said exclusive OR gate chips is connected to said photoelectric light beam source whereby upon the failure thereof, said chip produces a high output signal.

8. The system as claimed in claim 6 wherein said secondary circuit includes an optical coupler means and one of said exclusive OR gate chips that produces a low output upon the failure of said driver transistor means thereby activating the optical coupler means to disengage said relay means from operation.

9. A hand operated photoelectric switch for closing a mechanical relay in combination with primary and failure monitoring circuitry therefore comprising:
    a photoelectric switch means having an infrared light beam generating means and a light beam sensor means conducting current upon receipt of the infrared light beam, said light beam being hand interruptable;
    integrated circuit electrically connected with said light beam generating means and light beam sensor means including a plurality of exclusive OR gate chips and means for connecting them between said photoelectric switch means and a mechanical relay;
    said mechanical relay capable of being electrically connected to machinery for the cycling operation thereof;
    a first of said exclusive OR gate chips having a low output state upon the interruption of the light beam and means for connecting the first of said exclusive OR gate chips to a first coupler means;

means for causing current to flow in said first coupler means upon said low output of said first exclusive OR gate chip;

means for connecting said first coupler means to a driver means electrically connected to said mechanical relay for providing current thereto when current flows through said driver means;

means for connecting said driver means to said mechanical relay whereby upon conducting current therethrough said mechanical relay closes; and, monitoring circuit means for detecting failure of either said infrared light generating means or said driver means;

said monitoring circuit means including means for preventing current to flow to said mechanical relay upon the failure of either of said infrared light generating means or said driver means.

10. The switch as claimed in claim 9 wherein said monitoring circuit means includes a second of said exclusive OR gate chips being connected to said light beam generating means and upon the failure of said light beam generating means produces a high output signal, and said first exclusive OR gate chip receiving said high output signal therefrom and a low input signal from said light beam sensor means, whereby to provide a high output and thereby preventing current to flow in said first coupler means.

11. The switch as claimed in claim 9 wherein said monitoring circuit means includes a third of said exclusive OR gate chips of said integrated circuit;

a second coupler means for connecting said third exclusive OR gate chip to said driver means whereby upon the conduction of current through said driver means said second coupler means conducts a high input to said third exclusive OR gate chip;

means connecting said third exclusive OR gate chip to receive said low input from said first chip when the beam is interrupted whereby upon receiving said high input from said driver means said third exclusive OR gate chip generates a high output;

means for connecting said third exclusive OR gate chip output to a third coupler means;

whereby upon the receipt of high input from said second coupler means, and receiving high input from the first said chip when the beam is not interrupted, said third exclusive OR gate chip will produce low output;

said third coupler means having means for conducting current responsive to receiving said low input signal from said third exclusive OR gate chip whereby to produce an output signal;

means for connecting said third optical coupler means to second relay means;

means for connecting said second relay means to said mechanical relay; and, said second relay means opening the circuit to said mechanical relay upon the receipt of the output signal from said third coupler means whereby upon the failure of the driver means when the light beam is not interrupted said monitoring circuit prevents the unintentional operation of the mechanical relay.

12. The switch as claimed in claim 9 wherein said light beam generating means comprises an infrared light emitting diode.

13. The switch as claimed in claim 9 wherein said light beam sensor means comprises an infrared phototransistor.

14. The switch as claimed in claim 9 wherein said integrated circuit means including four exclusive OR gate chips.

15. The switch as claimed in claim 9 wherein said driver means comprises an n-p-n transistor.

16. The switch as claimed in claim 9 wherein said switch includes a housing having a channel means with an interrupt space means for the passage of an operator's hand or fingers into the path of said light beam, said channel means having side walls and a bottom wall and being open at the top, wherein said bottom wall is spaced downward from said light beam path a distance whereby to prevent said operator's fingers from inadvertently passing past the light beam.

17. The switch as claimed in claim 16 wherein said distance that the bottom wall is spaced from said light beam is no greater than one-half ($\frac{1}{2}$) inch.

* * * * *